(12) United States Patent
Yeh et al.

(10) Patent No.: US 7,363,436 B1
(45) Date of Patent: Apr. 22, 2008

(54) COLLISION DETECTION IN A MULTI-PORT MEMORY SYSTEM

(75) Inventors: Tzong-Kwang Henry Yeh, Palo Alto, CA (US); Bill Beane, Gustine, CA (US); Chung Han Lin, Milipitas, CA (US); Wei-Ling Chang, Redwood City, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 10/808,253

(22) Filed: Mar. 23, 2004

Related U.S. Application Data

(60) Provisional application No. 60/548,527, filed on Feb. 26, 2004.

(51) Int. Cl.
*G06F 12/00* (2006.01)
(52) U.S. Cl. .................... 711/149; 711/151; 711/152
(58) Field of Classification Search ............ None
See application file for complete search history.

(56) References Cited

U.S. PATENT DOCUMENTS

| | | |
|---|---|---|
| 4,104,719 A | 8/1978 | Chu et al. |
| 5,398,211 A | 3/1995 | Willenz et al. |
| 5,448,714 A | 9/1995 | Stodieck |
| 6,169,700 B1 * | 1/2001 | Luo ................... 365/230.05 |
| 6,457,087 B1 * | 9/2002 | Fu ........................ 710/305 |
| 6,578,118 B1 | 6/2003 | Raza et al. |
| 2003/0023823 A1 * | 1/2003 | Woo et al. ............ 711/167 |
| 2004/0068633 A1 * | 4/2004 | Engelahardt ......... 711/167 |
| 2004/0148559 A1 * | 7/2004 | Fetzer et al. ......... 714/800 |

FOREIGN PATENT DOCUMENTS

| | | |
|---|---|---|
| EP | 0 192 209 A1 | 8/1986 |
| JP | 62-175993 A | 8/1987 |

OTHER PUBLICATIONS

PCT Search Report for Intl. Appl. No. PCT/US2005/000027, issued Aug. 19, 2005, 4 pages.
Written Opinion for Intl. Appl. No. PCT/US2005/000027, issued Aug. 19, 2005, 9 pages.

* cited by examiner

*Primary Examiner*—Reginald Bragdon
*Assistant Examiner*—Horace L. Flournoy
(74) *Attorney, Agent, or Firm*—Finnegan, Henderson, et al.

(57) ABSTRACT

A collision detection circuit for a multi-port memory system is presented. The collision detection circuit detects a collision condition if the addresses at two or more ports at the same time match and if one of the two or more ports is writing to the memory location associated with that address. A collision flag can then be set when the collision condition exists. In some embodiments, arbitration can occur when the collision flag is set.

15 Claims, 5 Drawing Sheets

COLLISION DETECTION IN A MULTI-PORT MEMORY SYSTEM

RELATED ART

The present invention claims priority to Provisional Patent Application No. 60/548,527 entitled Synchronous Collision Detection, filed on Feb. 26, 2004, by the same inventors as the present disclosure, which is herein incorporated by reference in its entirety.

BACKGROUND

1. Field of the Invention

The present invention relates to dual port memory systems and, in particular, to collision detection in dual port memory systems.

2. Discussion of Related Art

In many computational systems, the ability for two or more processors to access the same memory array, and in particular the same memory location, simultaneously has become important. For example, the ability for peripheral devices and a processor in a computer system to access the same memory array allows for transfer of data to the peripheral devices, or even between peripheral devices, without intervention of the processor itself. In some systems, such a memory system allows multiple devices operating according to different clock signals to pass information between the devices without synchronizing the clocks. Additionally, fast switching of data in communications systems can be attained when different devices can simultaneously access the same memory locations.

Multi-port memory systems allow multiple devices to utilize the same memory array at the same time. In general, each of the devices can read and write to the memory array. The memory array can utilize multi-port memory cells to allow simultaneous access to any address in the memory array from any of the ports. In some embodiments, a pipelining circuit at each port can control data and address inputs and can provide minimal setup and hold times. In general, a wide variety of options and features (e.g., pipelining or flow-through modes, synchronous operations on one or multiple ports, separate byte controls for read and write operations, packaging features, and support for various standards) can be available on a multi-port memory system.

Dual port memory systems, for example, can be utilized in mobile and wireless technologies, networking applications, storage area networks, enterprise systems, and other systems. Dual port memory systems are particularly useful in high speed routers, switches, and other networking environments. Further, dual port memory systems are useful in graphics and multi-media applications, medical applications, and signal processing.

With two or more independent processors potentially capable of accessing the same memory location in the memory array at the same time, the potential for both processors to attempt access to the same memory location at the same time is high. In some cases, the attempts by both processors to access the same location can result in the erroneous readout of data or the erroneous write of data to the memory array.

Schemes have been devised to prevent such dual access of the same memory location within the memory array. In some approaches, the ports are arbitrated such that the first port that requests access to the memory location has priority and a second port attempting access to the same memory location receives a busy signal until the first port has completed its operation at which time the second port can gain access to the memory location. Such an arbitration scheme is described in European Patent Application 86101935.4, EP 0192209 A1, filed by Honeywell, Inc., on Feb. 15, 1986. In another approach, such as that described in U.S. Pat. No. 5,398,211 issued to Willenz et al. on Mar. 14, 1995, one port always has priority over all other ports. Other ports that attempt to access a particular memory location will obtain a busy signal during this time the preferred port requests access to that memory location.

However, schemes for arbitrating access to memory locations within a memory array when contentions occur can significantly decrease the throughput of a memory device. In certain sequential systems, bandwidth can be high, especially in telecommunications systems where fast switching of digital data between devices can be required. Contention methods that slow the data flow rate, such as arbitration scheme circuitry, are not desirable.

Therefore, there is a need for multi-port memory systems with the capability to recognize and handle simultaneous accesses by each port a single memory location in a memory array without affecting the bandwidth of the multi-port memory system.

SUMMARY OF THE INVENTION

In accordance with the present invention, a multi-port memory system is presented that includes a collision detection circuit. A collision detection circuit can recognize simultaneous access of individual memory locations by two or more ports and can provide collision flags to those ports that may have read or written corrupted data as a result of that simultaneous access. In some embodiments, a collision detection circuit operates in parallel with access to the memory array and therefore does not affect the bandwidth of the memory array.

In some embodiments, the memory addresses presented at the ports are compared and, if there is a match between two or more of the memory addresses (e.g. matched ports), determination of whether a collision condition exists for those ports where a match occurs is made. If all the matched ports are reading from the same memory location, as indicated by the match in the memory addresses, then no collision exists among the ports. If one port is writing to a memory location, however, a collision condition exists for ports that are reading from that same memory location. Further, if more than one port is writing to the same memory location, then a collision condition exists for all ports writing to that memory location. In accordance with some embodiments of the present invention, collision flags can be set for those ports where a collision condition is detected.

Therefore, a multi-port memory system according to the present invention includes a memory array with an addressable array of memory locations; at least two ports coupled to the memory array, each of the at least two ports transmitting to the memory array an address, a clock signal, and a read/write control signal; and a collision detect circuit coupled to receive the address, the clock signal, and the read/write control signal from each of the at least two ports. The collision detect circuit sets a collision flag when a collision condition is detected in any of the at least two ports.

A dual port memory system according to the present invention includes a memory array coupled to receive a left port memory address and a right port memory address; and a collision detect circuit configured to detect a match between the left port memory address and the right port memory address, and generate a left port collision flag if the right port is writing data, and generate a right port collision flag if the left port is writing data.

A method of collision detection according to the present invention includes detecting an address match between two or more ports; and generating a collision flag for at least one of the two or more ports of any of the other of the two or more ports are writing.

A method of collision detection in a dual port memory system according to the present invention includes detecting that a left port address to be presented to a left port is identical to a right port address to be presented to a right port; and generating a left port collision flag if a write operation is being processed for the right port address at the right port.

These and other embodiments are further discussed below with reference to the following figures. It is to be understood that both the foregoing general description and the following detailed description are exemplary and explanatory only and are not restrictive of the invention, as claimed.

DESCRIPTION OF THE EMBODIMENTS

Figure 1A:
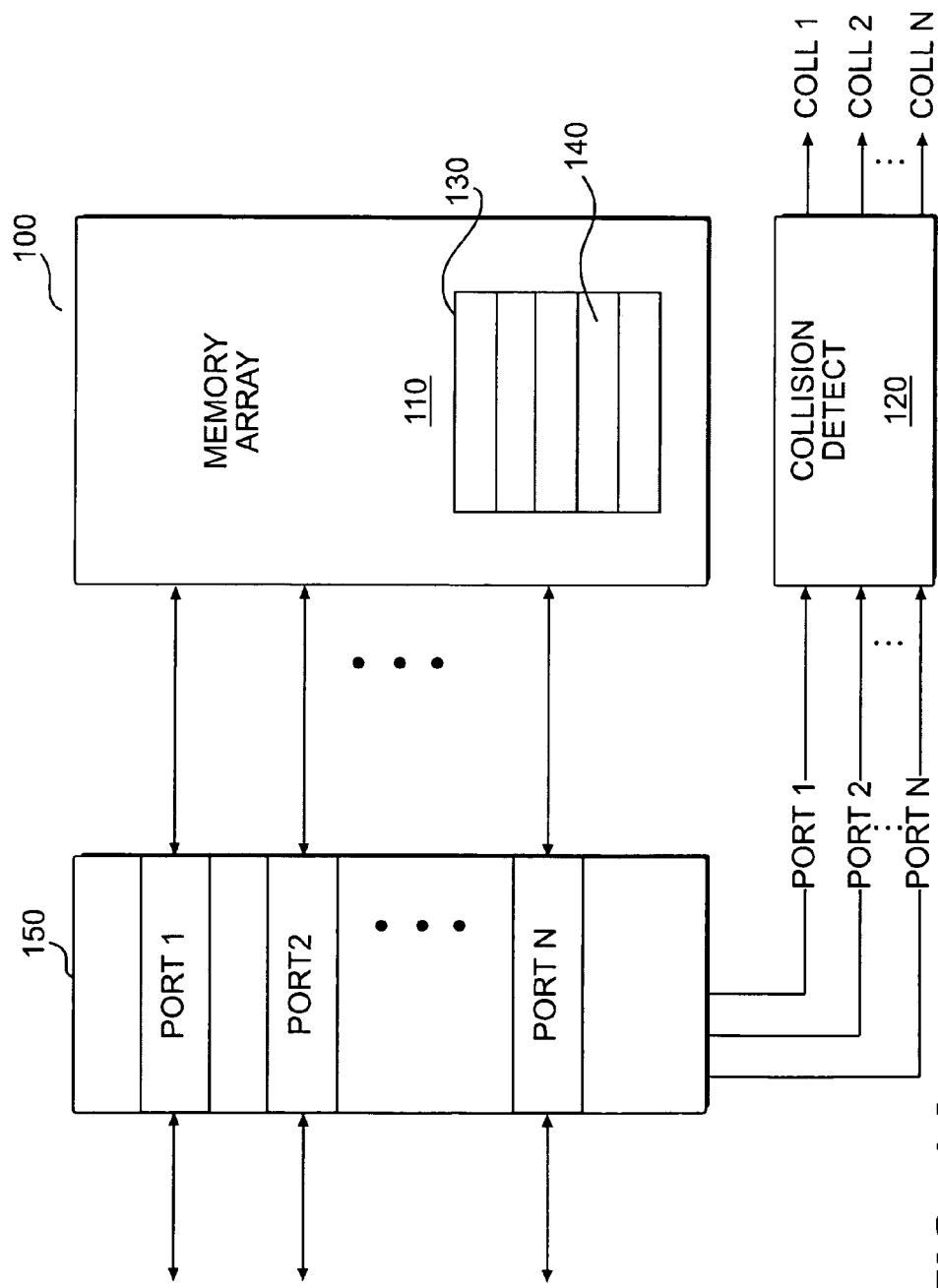
FIG. 1A illustrates an embodiment of a multi-port memory system with collision detection according to the present invention.

FIG. 1A illustrates a multi-port memory system 100 according to some embodiments of the present invention. Multi-port memory system 100 includes memory array 110 and collision detect 120. Memory array 110 includes an array of addressable memory locations 130 that are accessible through ports 1 through N. An arbitrary memory location of the array of addressable memory locations 130 has, for convenience, been labeled memory location 140. Memory location 130 is addressable by a memory address.

In some embodiments, each of ports 1 through N provides independent simultaneous access to each of memory locations 130 in memory array 100. Each of ports 1 through N can, for example, include a clock signal, address lines, data lines for read of data from memory array 110 and write of data to memory array 110, chip enable signals, and control lines. In some embodiments, each of ports 1 through N can independently and simultaneously read and write to each memory location 130 in memory array 110 according to its independent clock signal.

A logic circuit 150 can control interfacing of the clock signals, control signals, address signals, and data signals between an external user of memory system 100 and memory array 110. Additional logic and control circuitry within memory array 110 can control access and read/write operations to individual memory locations in memory array 110.

Collisions can occur when two or more ports access the same memory location 140, an arbitrary memory location in memory array 110. In particular, a collision occurs when there exists an overlap of access between at least two ports resulting in the potential of at least one of the ports reading or writing incorrect data to a specific address in memory array 110. Such collisions can be detected in collision detect 120. In some embodiments of the invention, collision detect 120 receives the addresses, clock signals, and read/write control signals input to logic circuit 150 or, in some embodiments, input to memory array 110 from logic circuit 150. Collision detect 120 detects collisions involving individual ports and outputs a collision flag for each port, $Coll_1$ through $Coll_N$, as a result. A processor coupled to each port can respond accordingly to each of the collision flags for each port.

If two or more ports access memory location 140 in memory array 110 at the same time, then a collision may occur for one or more of those ports, resulting in a collision flag being set by collision detect 120. However, if all the ports are reading from memory location 140 at the same time, no data is corrupted, lost, or incorrectly read and therefore no collision occurs. As a result, no collision flags are set by collision detect 120 for any of the two or more ports.

When one of the ports is writing to memory location 140 at the same time that the other ports are reading from memory location 140, then there is a potential that those ports that are reading from memory location 140 will capture data that is in a state of transition. However, the write operation from the port that is writing will not result in corrupted data being written into memory location 140. There may occur situations that do not result in a collision flag where a port reads data from memory location 140 before or after a write to memory location 140 by another port, resulting in the reading of possibly stale data. The data read before or after the write operation is performed on memory location 140 can still be considered valid, however, and therefore no collision flag is generated.

Therefore, collision detect 120 can set a collision flag for all ports that are reading from memory location 140 at the same time that another port is writing to memory location 140. A collision flag does not need to be indicated for the single port that is writing to memory location 140. Processors that are coupled through ports where a collision flag is set can then determine whether to re-assert the read operation at a later time to ensure a valid read operation.

If more than one port is writing to the same memory location, e.g., memory location 140 in memory array 110, at the same time, then there is a risk that the writing ports will interfere with each other, resulting in indeterminate data being written into memory location 140. As a result, memory location 140 can contain a random combination of the write data for each of the ports writing to memory location 140.

In cases where one port writes to memory location 140 and a second port immediately rewrites memory location 140, no collision flag is set because the data in memory location 140 is valid after the second write. However the data stored in memory location 140 depends on which port writes to memory location 140 last.

Therefore, when more than one port attempts to write to memory location 140 in memory array 110 at the same time, collision detect 120 can set a collision detect flag to all of the ports that are writing to memory location 140 at the same time. As indicated above, collision detect 120 can also set collision detect flags for all ports reading from memory location 140 at the same time that a write to memory location 140 from another port is being performed.

Two further considerations can be important for collision detection. First, collision detect 120 can fail to detect and report a valid collision. Second, collision detect 120 can report collisions when, in fact, none existed. This difficulty in predicting collisions is a result, primarily, of the potentially asynchronous independent clocks input into each of ports 1 through N. Although in some embodiments of the invention the clock signals input to each of the ports can be related in known ways (e.g., may be synchronous), and in certain cases can be the same clock signal, in some embodiments, each clock signal can have its own frequency and phase, independent of all of the other clock signals for each of the other ports. As such, it can be difficult to determine whether collisions will occur within memory array 110 or in what order collisions can occur between ports (i.e., which port may request access to the particular memory location first among the ports requesting access to a particular memory location). Timing issues can become particularly important at high clock frequencies. As such, some embodiments of collision detect 120 can tend to over report collisions (i.e., reporting collisions that do not actually occur), and some embodiments can tend to underreport collisions missing some of the collisions.

Referring again to FIG. 1A, in some embodiments the addresses presented to collision detect 120 will not be presented to memory array 110 for one or more clock cycles. That may be the case, for example, if control logic 150 represents a pipelined system. In some embodiments, for example where the clocks of each of the ports are the same, arbitration (i.e., access control that prevents actual collisions) may be undertaken between the left port and the right port before collisions actually occur. In embodiments where the clocks on each port are independent and may have a different phase and frequency, collision detect 120 can perform arbitration by determining which port attempts access first and provide a busy signal to the port that arrives second. Where the two clocks are not the same clock, however, timing concerns in implementing arbitration upon collision detection may render the approach difficult to implement. Further, embodiments that implement arbitration may operate slower than embodiments that do not arbitrate.

In essence, there may not be sufficient time in a single clock cycle to determine which port began its access first, allow that port to continue its access, issue a busy signal to the losing port, and then allow access to the losing port. To optimize the bandwidth of synchronized memory systems, it is important that internal access to memory location 140 begin as soon as possible. Interrupting access to force arbitration can create a significant potential for metastability within memory system 100.

Imposing internal pipeline stages in memory system 100 in order to affect arbitration when the clocks on each port are not closely related may not completely resolve the timing issues because of the unpredictable nature generally of the relationship between the clocks on the individual ports. In some embodiments, therefore, arbitration procedures can be implemented by forcing the ports of multi-port memory system 100 to operate at the same frequency and/or to be synchronous, or to use the same clock. In some embodiments, such devices may run significantly slower than other synchronous memory systems 100 that do not arbitrate.

In embodiments where each of the ports of memory system 100 use the same clock, arbitration is not determined by time of first access. Instead, one of the ports can be defined as a priority port and access to memory location 140 in memory array 110 by the priority port takes precedence over access to that memory location by any of the other ports. In some embodiments, each of the ports of memory array 110 can be assigned a priority with respect to each of the other ports. Again, if ports accessing memory location 140 simultaneously are reading, no arbitration is needed. If one port is writing to memory location 140 at the same time that other ports are reading from memory location 140, then in some embodiments the write may be performed first and the reading ports are provided with a busy signal and allowed to read after completion of the write operation. If both ports are writing, then the priority port can write and all other port's write operations can be discarded. Again, collision flags can be generated as described above. One skilled in the art will recognize that other arbitration schemes can be implemented.

In most embodiments, arbitration in memory system 100 is not attempted. Inclusion of arbitration may restrict the device to a single input clock operating at a lower frequency, which can impact the bandwidth and flexibility of memory system 100. Therefore, some embodiments of memory system 100 simply indicate that a collision has occurred without attempting to arbitrate or otherwise affect the collision itself. In that way, collision detect 120 can operate in parallel with memory array 110 and control logic 150 and does not affect the speed or operation of memory array 110 or control logic 150. In that case, the limiting speed of the clocks input to the ports is the limiting speed of logic 150 and memory array 110, and is not affected by collision detect 120. Further, embodiments where the clock for each port is independent (i.e., can have different frequencies and are asynchronous with respect to each other) can be more easily implemented.

Again, the variability of the timing relationship between the two ports is a significant issue defining the functionality of memory system 100. The inability to know in advance which port will be starting first, and to what degree accesses will overlap, makes it extremely difficult to guarantee that a collision alert flag can be set to the appropriate port on the very next rising edge of that port's clock with the desired system speeds. In some cases, the signal may not be set until the subsequent rising edge. As a result, the collision flag will tell a processor attached to that port that a collision has occurred within the last two accesses, but may not be able to indicate whether it was the most recent access or the preceding access where a collision occurs.

Figure 1B:
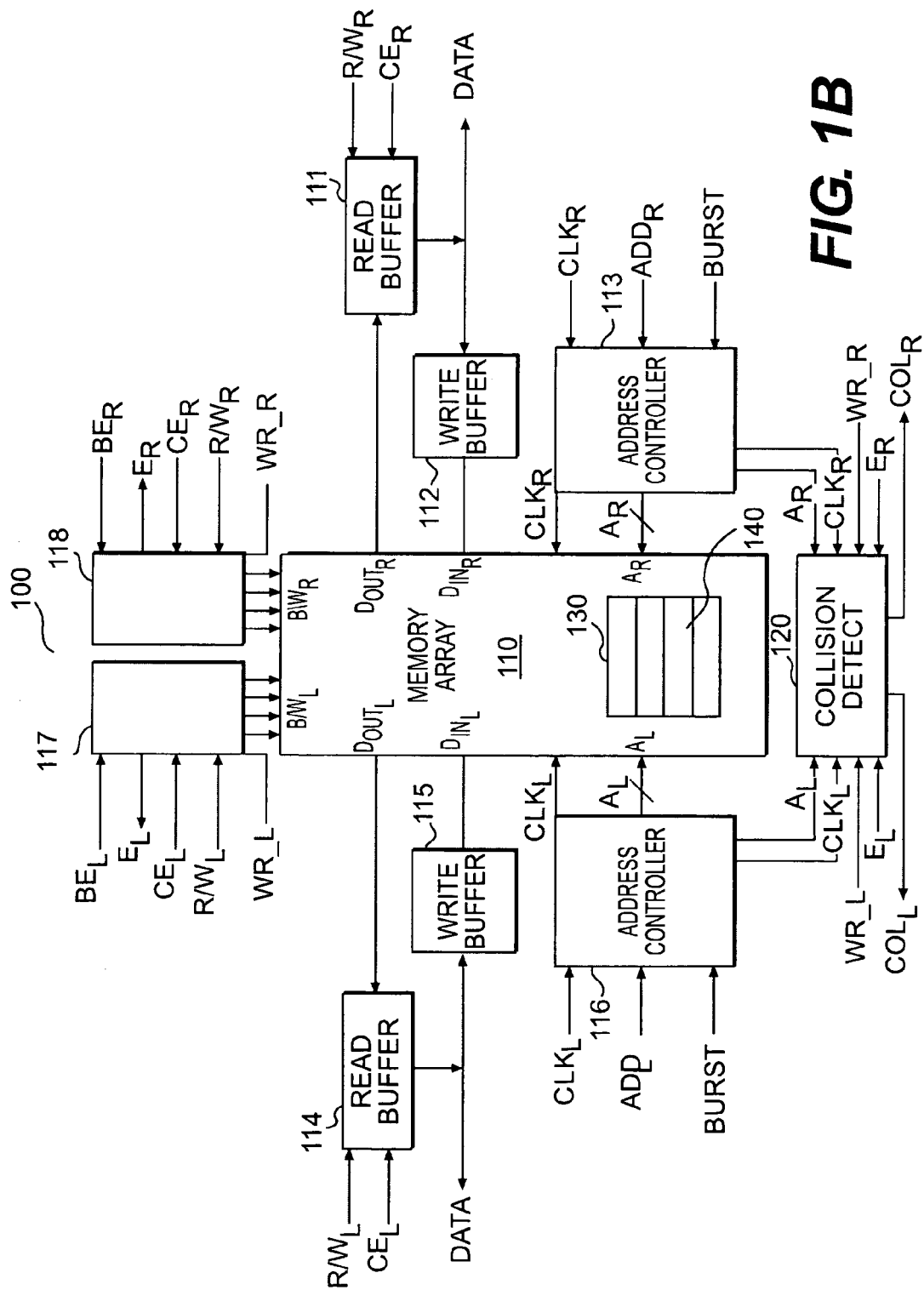
FIG. 1B illustrates an embodiment of a dual-port memory system with collision detection according to the present invention.

FIG. 1B illustrates, in particular, a dual port embodiment of memory system 100. A dual-port embodiment of memory system 100, as shown in FIG. 1B, includes a left port and a right port. One skilled in the art will be able to generalize from the disclosure of embodiments of a dual port memory system 100 to the more general multi-port memory system 100 illustrated in FIG. 1A.

FIG. 1B shows a detailed block diagram of dual port memory system 100 with a memory array 110. Memory array 110 can be SRAM or DRAM memory of any size. In some embodiments, the memory cells (i.e., individual cells of memory location 140) of memory array 110 allow simultaneous access to the same memory location from each of the two ports. As shown in FIG. 1B, memory array 110 includes an address input terminal to receive a left address $A_L$ into the left port and an address input terminal to receive a right address $A_R$ into the right port. Further, memory array 110 includes input terminals for a left clock $CLK_L$ and a right clock $CLK_R$, where left clock $CLK_L$ controls the timing for access to a memory location from the left port and right clock $CLK_R$ controls the timing for access to a memory location from the right port.

In some embodiments, the right address $A_R$ is input to memory array 110 from an address controller 113. Address controller 113 can receive an address ADDR, the right clock $CLK_R$, and burst controls (i.e., control signals that control burst-mode read and write accesses). Burst mode addressing to the right port, then, can be controlled by address controller 113.

Similarly, the left address $A_L$ is input to memory array 110 from an address controller 116. Address controller 116 can receive an address ADDL, the left clock $CLK_L$, and burst controls. Burst mode addressing to the left port, then, can also be controlled by address controller 116.

Addresses and data sizes in memory system 100 (FIG. 1B) can be of any size. In some embodiments, addresses can be 18-bit addresses and data can be 36-bit data. Those skilled in the art will recognize other systems with larger or smaller addresses and data sizes. Again, as shown in FIG. 1B, memory array 110 includes an array of addressable memory locations 130 where memory location 140 is an arbitrary one of the addressable memory locations 130.

Memory array 110 can also include left and right data input terminals $DIN_L$ and $DIN_R$, respectively, for receiving data to be written into memory array 110 from the left port and the right port, respectively. In the left port, input data can be buffered by write buffer 115. Similarly, in the right port input data can be buffered by write buffer 112.

Memory array 110 can also include left and right data output terminals $D_{outl}$ and $D_{outr}$, respectively. Data from the left data output terminal can be buffered by read buffer 114 while data from the right data output terminal can be buffered by read buffer 111. In some embodiments, data output from read buffers 114 and 111 can be output on the same data pins of memory system 100.

Read and write controls can be controlled in left controller 117 and right controller 118. As is shown in FIG. 1B, individual byte write controls for read and write operations can be utilized. In the embodiment shown in FIG. 1B, individual byte enables $BE_L$ for each byte of data can be input to left controller 117. A $R/W_L$ signal and $CE_L$ together control whether a read or write function is performed on the left port of memory array 110. Similarly, individual byte enables $BE_R$ for each byte of data can be input to right controller 118 and signals $R/W_R$ and $CE_R$ control whether a read or a write operation is performed.

Communications systems can impose different timing considerations on accessing memory system 100. Embodiments that are pipelined, for example, may present addresses to memory system 100 several clock cycles before data is presented for write into memory 110 or read from memory array 110. Additionally, flow through systems may also buffer addresses and data for several clock cycles before an address and its associated control signals are actually presented to memory array 110 for processing by memory array 110.

In accordance with the present invention, memory system 100 includes a collision detect 120. Collision detect 120 receives a left address $A_L$ from address controller 116 and a right address $A_R$ from address controller 113. Collision detect 120 also receives control signals associated with the addresses. As shown in FIG. 1B, collision detect 120 receives the signals WR_L and $E_L$ that are associated with the left address $A_L$. Collision detect 120 also receives the left clock $CLK_L$. Similarly, collision detect 120 receives the right clock $CLK_R$ along with the signals WR_R and $E_R$ associated with the right address $A_R$. As indicated in FIG. 1B, the signals WR_R and WR_L can be derivative signals from the $R/W_R$ and $R/W_L$ signals input to memory system 100. Similarly, the enable signals $E_R$ and $E_L$ are derivative from the chip enable signals $CE_R$ and $CE_L$, respectively.

In some embodiments, signals are presented to collision detect 120 at the same time that those signals are presented to memory array 110. In some embodiments, signals can be presented to collision detect 120 one or more clock cycles prior to presentation to memory array 110. Collision detect 120 detects collisions in either or both of the left port and the right port. Table I indicates a truth table for some embodiments of collision detect 120.

TABLE I

| Left Port | | | | | Right Port | | | | | Function |
|---|---|---|---|---|---|---|---|---|---|---|
| CLK | WR_L | $E_L$ | A | Coll | CLK | WR_R | $E_R$ | A | Coll | |
| ↑ | R | E | = | N | ↑ | R | E | = | N | Both ports reading, no collision indicated. |
| ↑ | R | E | = | Y | ↑ | W | E | = | N | Left port reading, right port writing, collision flag set on left port. |
| ↑ | W | E | = | N | ↑ | R | E | = | Y | Right port reading, left port writing, collision flag set on right port. |
| ↑ | W | E | = | Y | ↑ | W | E | = | Y | Both ports writing, collision flag set on both ports. |

As shown in Table I, in some embodiments determination of whether or not a collision condition exists (indicated in the Coll column) at either the right port or the left port is made on the rising edge of the clock signal for the left port ($CLK_L$) for the left collision condition and the rising edge of the clock signal for the right port ($CLK_R$) for the right collision condition. For the left port and the right port, no collision flag is set if the associated enable ($E_R$ or $E_L$) signal is not set to enable and if the address $A_L$ and $A_R$ do not match.

As illustrated in Table I, a collision is indicated when both left and right ports attempt to access the same memory location at the same time and at least one of the ports is attempting a write operation, or writing. Therefore, if both ports attempt to read from memory location 140 in memory array 110 at the same time, then no collision condition exists. However, if one port attempts to read from memory location 140 while the other port is writing to memory location 140, a collision flag is sent to the port that is attempting to read. Additionally, if both ports are attempting to write to memory location 140, then a collision condition exists for both ports.

In some embodiments, when a collision condition exists, a collision flag $Col_L$ or $Col_R$ in FIG. 1B, is set. In some embodiments, an interrupt, can also be sent. The collision flag is sent to the processor where a collision condition exists so that error correction routines or other steps may be taken in order to correct the results of the collision.

Figure 4:
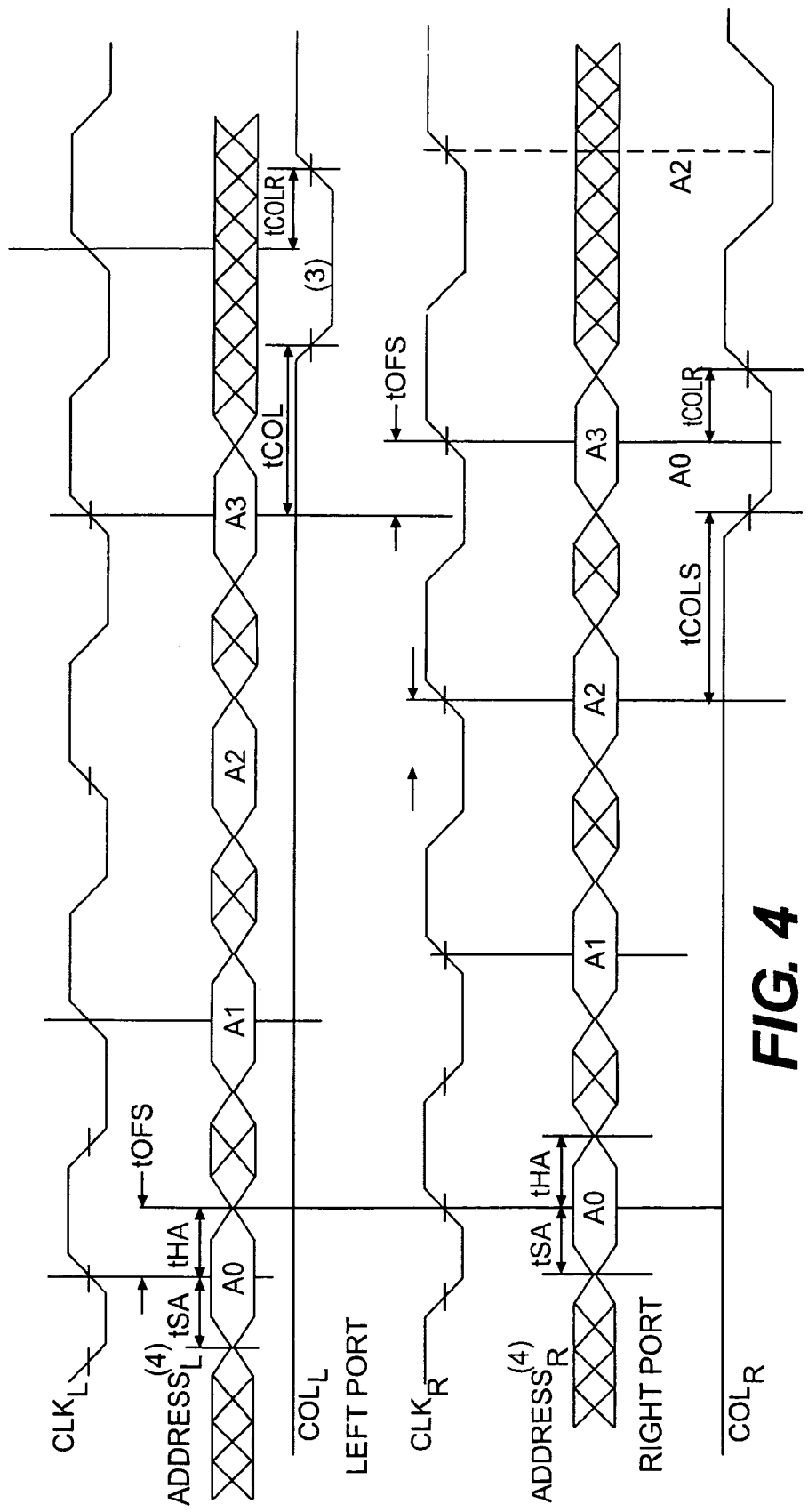
FIG. 4 illustrates a collision detection timing diagram appropriate for the embodiment of a collision detection circuit shown in FIG. 2.

As discussed, clock signals $CLK_L$ and $CLK_R$ may differ in both phase and frequency. FIG. 4 illustrates the timing of collision detection for some embodiments of the present invention. The timing diagram of FIG. 4 illustrates the left port clock $CLK_L$, addresses input according to the left port clock $CLK_L$, and collision flags set to the left port by collision detect 120. Further, the timing diagram illustrates the right port clock $CLK_R$, which in this example lags the left port clock $CLK_L$, identical addresses clocked into the right port as those clocked into the left port, and the collision flags set for the right port by collision detect 120.

In the timing diagram of FIG. 4, both the left port and the right port are initially writing. The left port clock is leading the right port clock by an amount $t_{ofs}$. As can be seen, there are two regions. A first region occurs when the rising edge of the right clock $CLK_R$ is still aligned with a valid address on the left port. A second region occurs between the point of an invalid first address and a valid second address. For a clock with a cycle time of 5 ns, for example, region 1 can occur in the region of $t_{ofs}$ between 0 and 2.8 ns and region 2 in the region of $t_{ofs}$ between 2.81 and 4.6 ns. A fan clock cycle time if 6 ns region 1 can have $t_{ofs}$ between 0 and 3.8 ns and region 2 can have $t_{ofs}$ between about 3.81 and 5.6 ns. Similarly, for a clock cycle time of 7.5 ns, $t_{ofs}$ in region 1 is between 0 and 5.3 ns and region 2 is between 5.31 and 7.1 ns. Region definitions can depend not only on cycle time but also on set-up and hold times for addresses.

In region 1, and the timing situation shown in FIG. 4 with both ports writing, collision flag signals are shown a number of cycles after each timing cycle. However, in some embodiments, if a collision occurs two cycles in a row, the second collision may not be indicated. Therefore, collisions for address $A_0$ and $A_2$ in the are indicated but the collision on address $A_1$ may not be indicated. In region 2, the leading port may show collisions for address $A_0$ and $A_3$ while the trailing port shows collisions for address $A_0$, $A_2$.

Figure 2:
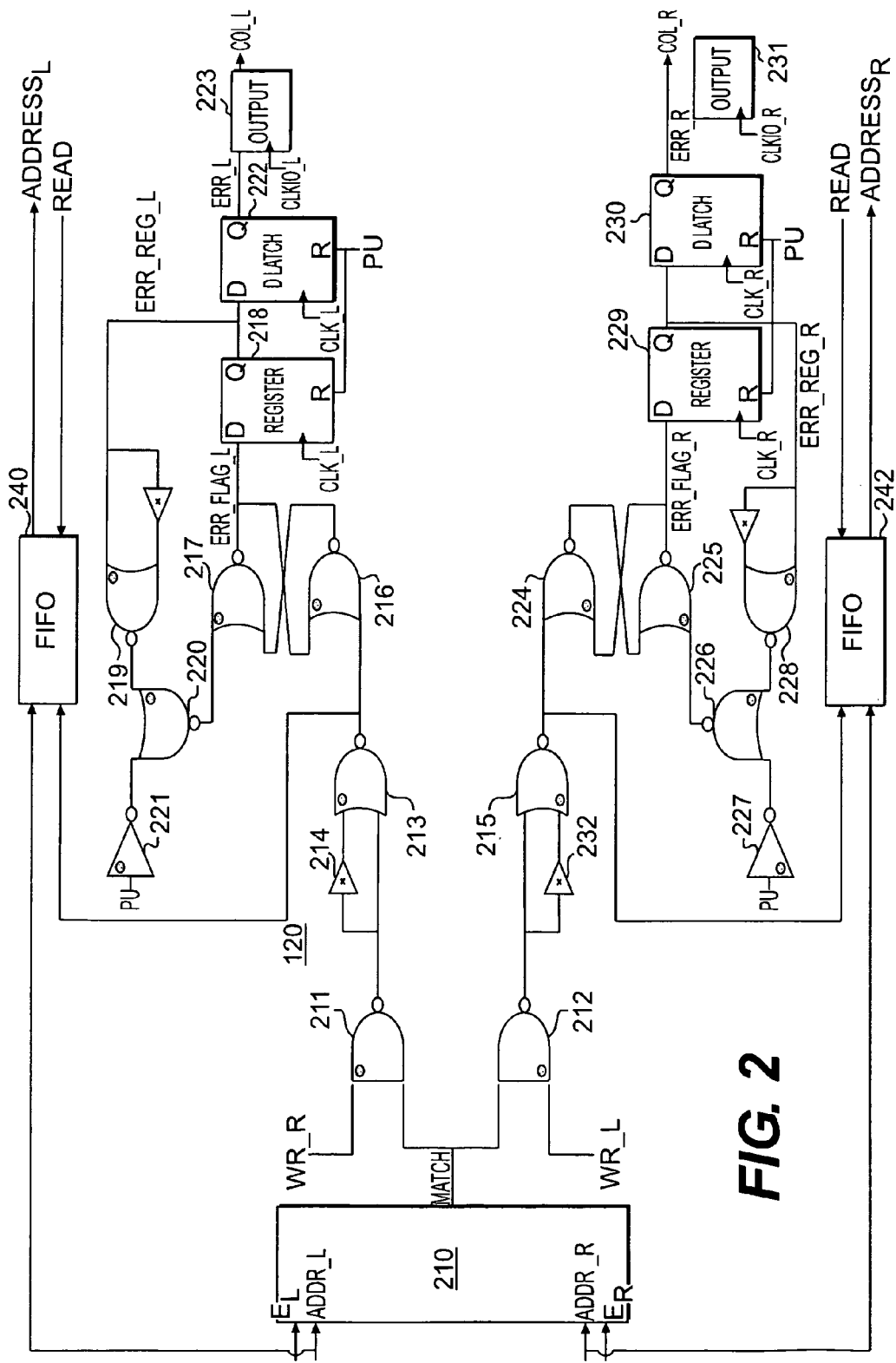
FIG. 2 illustrates an embodiment of a collision detection circuit according to some embodiments of the present invention.

FIG. 2 shows an embodiment of collision detect 120 according to the present invention. In collision detect 120 as shown in FIG. 2, a low R/W signal indicates a read and a high R/W signal indicates a write. The enable signal CE is low when enabled and high when not enabled. An address match is indicated by a high signal while no address match is indicated by a low signal. Embodiments of the invention may utilize a different signaling scheme or may implement other electronics to produce the same or similar results.

As is indicated in FIG. 2, the left port and right port addresses as well as the signals $CE_L$ and $CE_R$ (or in some embodiments the logical inverse of $CE_L$ and $CE_R$) are input to address comparison (comparator) 210. In some embodiments, the addresses of the left port and the right port correspond to the addresses $A_L$ and $A_R$ submitted to memory array 110.

If addresses $A_L$ and $A_R$ match and both $E_L$ and $E_R$ are high, indicating an enabled chip, then address comparator 210 outputs a logical high. Otherwise, address comparator 210 outputs a logical low.

Figure 3:
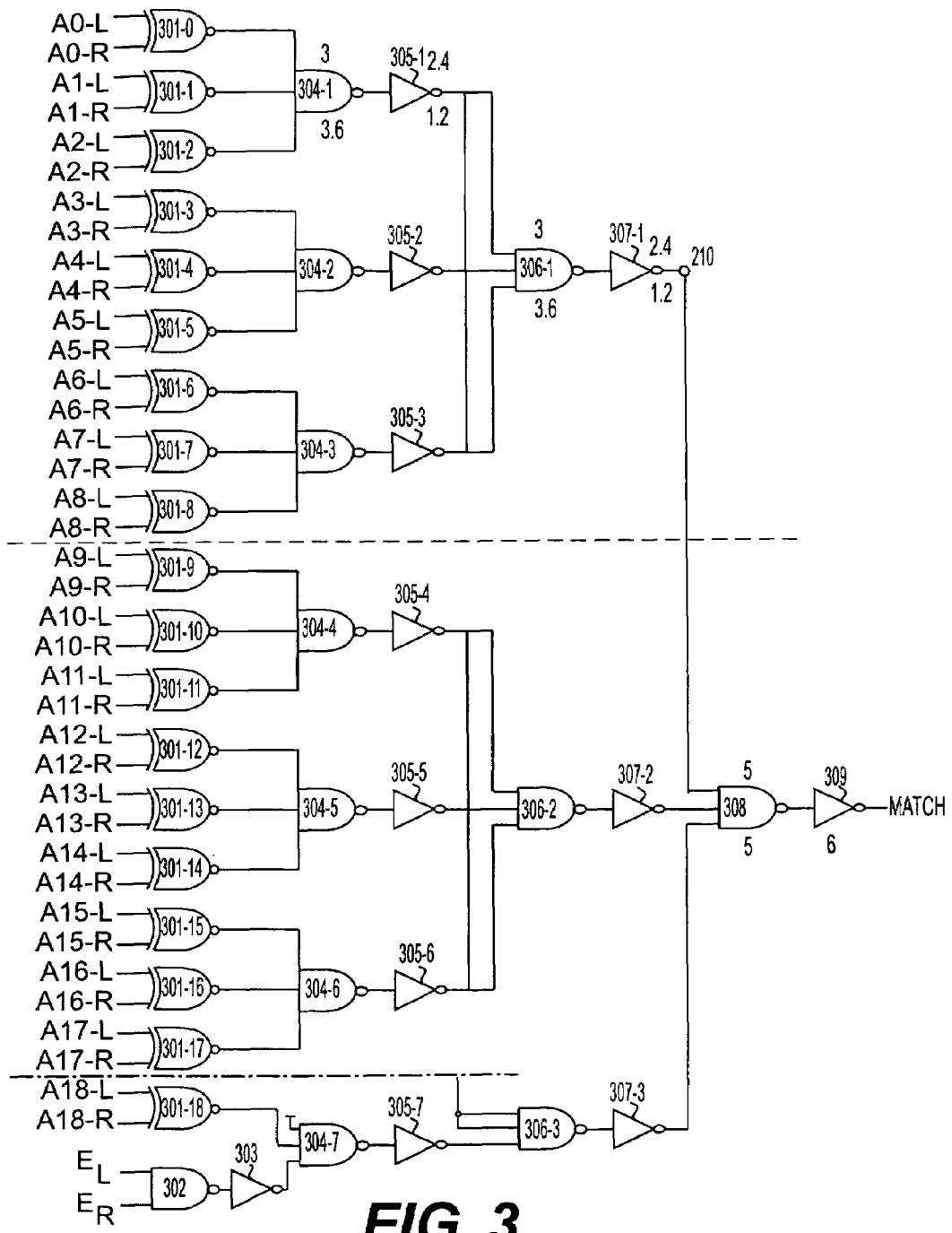
FIG. 3 illustrates an embodiment of an address comparison circuit that can be utilized in the embodiment of a collision detection circuit illustrated in FIG. 2.

An embodiment of address comparator 210 appropriate for a 19 bit address is shown in FIG. 3. Individual bits of the two addresses $A_L$ and $A_R$ are compared in exclusive NOR gates 301-0 through 301-18. Exclusive NOR gates 301-0 through 301-18 produce a logical high only if the two inputs match. Therefore, in order that the output signals from each of exclusive NOR gates 301-0 through 301-18 to be high, the two input address $A_L$ and $A_R$ match in a bitwise comparison. Additionally, the two enable signals $E_L$ and $E_R$ (which are the logical inverse of the corresponding chip enable signals $CE_L$ and $CE_R$) are input to NAND gate 302. NAND gate 302 provides a logical low only if both $E_L$ and $E_R$ are enabled (i.e., logical high). The signal from NAND gate 302 is inverted in inverter 303 to provide a logical high if both $E_L$ and $E_R$ are enabled. The output signals of XNOR gates 301-0 through 301-18 and the output signal of inverter 303 is input to NAND gates 304-1 through 304-7. Each of NAND gates 304-1 through 304-7, then, output a logical low if the addresses $A_L$ and $A_R$ match and $E_L$ and $E_R$ are both high. The output signals from NAND gates 304-1 through 304-7 are inverted in inverters 305-1 through 305-7, respectively, and input in threes to NAND gates 306-1 through 306-3. Again, the output signals from NAND gates 306-1 through 306-3 are all low only if addresses $A_L$ and $A_R$ match and $E_L$ and $E_R$ are both high. The output signals from NAND gates 306-1 through 306-3 are again inverted in inverters 307-1 through 307-3 and input to NAND gate 308. Again, the output signal from NAND gate 308 is low only if addresses $A_L$ and $A_R$ match and $E_L$ and $E_R$ are both high. The output signal from NAND gate 308 is inverted in inverter 309 to provide a high signal from comparison 210 only if addresses $A_L$ and $A_R$ match and $E_L$ and $E_R$ are both high.

As shown in FIG. 2, the output signal from comparator 210 is input to NAND gates 211 and 212. The right port R/W signal WR_R is also input to NAND gate 211. The output signal from NAND gate 211, then, is low only if both the output signal from comparison 210 and the signal WR_R is high, or if comparison 210 found a match and the right port signal indicates a write operation. As a consequence, NOR gate 213, with the output signal from NAND gate 211 and the signal from buffer 214 as input, is high only if comparison 210 found a match and the right port signal indicates a write operation. Buffer 214 serves to delay a signal into NOR gate 213 so that transient glitches can be discarded, i.e. only when the output signal from NAND gate 211 is low for a specified period of time does the output signal from NOR gate 213 go high.

The output signal from NOR gate 213 is then input to the flip-flop circuit formed by NOR gates 216 and 217. Therefore, normally the input signal to NOR gate 216 from NOR gate 213 is low. Further, the input to NOR gate 217 is low. The output signal from NOR gate 217 is also normally low and the output signal from NOR gate 216 is normally high. When an address match is detected and the right port is indicating a write, then the output signal from NOR gate 213 becomes high and the flip-flop formed by NOR gates 216 and 217 flips so that the output signal from NOR gate 217 becomes high and the output signal from NOR gate 216 becomes low. The output signal from NOR gate 217 is clocked into register 218 on the next rising edge of the left clock $CLK_L$. During the following cycle, the high signal on the output of register 218 resets the flip-flop by driving the output signal from NAND gate 219 low and therefore the output signal from NAND gate 220 high. The flip-flop formed by NAND gates 216 and 217 then returns to its normal state such that the output signal from NAND gate 217 is a low.

Therefore, the flip-flop formed by NOR gates 216 and 217 is set on input of a high signal from NOR gate 213 and, after being set, reset a half clock cycle later as a result of the output signal from latch 218. As a result, collisions detected in the clock cycle immediately following detection of a collision can be missed. In other words, the embodiment of collision detect 120 illustrated in FIG. 2 can provide a collision detect signal when a first collision is detected, but may not provide a collision detect signal when a second collision is detected in an immediately following clock cycle.

In some embodiments of the invention, if the output signal from NOR gate 213 is high (indicating a collision), then the address ADDL corresponding to that collision can be stored in a FIFO 240. In that case, even when a collision does not result in setting a collision flag, the address corresponding to the collision can be stored in FIFO 240. FIFO 240 can be read by the processor coupled to the left port. The processor coupled to the left port can read the addresses at which collisions have occurred from FIFO 240 and respond to those collisions appropriately. In some embodiments, the processor coupled to the left port can read addresses from FIFO 240 until FIFO 240 is empty.

The output signal from register 218 is then clocked into register 222 on the next falling edge of the clock $CLK_L$ so that the error detect signal is available at output 223 on the next rising edge of the left clock $CLK_L$. The error on the left port is high if an address match is detected and the right port signal WR_R indicates a write. Output 223, then, outputs a collision detect flag.

As shown in FIG. 2, setting of a collision detect signal in the right port, $COLL_R$, is accomplished in the same way as that described above for the left port. The output signal from comparator 210 along with the left port signal WR_L is input to NAND gate 212, the output of which drives NOR gate 215. Again, buffer 232 provides a delay in order that glitches do not result in a collision indication. Again, the output signal from NOR gate 215 goes high to flip the flip-flop formed by NOR gates 224 and 225 only if an address match is detected and the left port signal RW_L indicates a write. Additionally, addresses that correspond to this collision can be stored in FIFO 242 for later reading by the processor coupled to the right port. The output signal from NOR gate 225 is latched through registers 229 and 230 according to the right port clock $CLK_R$ and a collision detect signal is output from output 231. Again, the flip-flop formed by NOR gates 224 and 225 is reset after the flip-flop is set because the output signal from register 229 is input to NAND gate 228, which drives NAND gate 226.

In some embodiments, a power-up signal PU input through inverters 221 and 227 can be utilized to set registers 218, 222, 229, and 230 as well as reset the flip flops. Further, one skilled in the art will recognize that other circuits besides those embodiments shown in FIGS. 2 and 3 can be utilized to detect collisions as is described above.

As shown in FIG. 2, the collision detect flag is asserted on the next rising clock edge of the affect port following the collision and remains set for one cycle. During the next cycle, the internal reset represented by NAND 219 and NAND 220, for example, engages to reset the collision flag, negating the necessity of the processor coupled to that port having to reset the collision flag. If two collisions occur on subsequent clock cycles, the second collision will not generate a collision flag because of the state of the flip-flop. A third collision in a subsequent clock cycle will generate a collision detect flag. In the event that burst access is generated by both ports with the same starting address, collision flags, if they exist, will be asserted and cleared every other cycle.

In some embodiments, a latency cycle can be implemented on the collision flag so that the exact collision timing can be determined. However, collision detect 120 according to this embodiment can be significantly more complex than that described with FIG. 2 and may not perform at high frequencies, or scale to higher operating frequencies, as readily as the embodiment of collision detect illustrated in FIG. 2.

Embodiments of memory system 100 with collision detection according to the present invention represents significant applicability over conventional multi-port systems. Memory system 100 sustains high bandwidth and can detect collisions and output collision flags as appropriate at the highest operating frequencies at which memory array 100 and logic 150 can operate. Additionally, great flexibility can be obtained by embodiments of memory system 100 that allow for separate and independent clocks on each port.

Processors coupled to the ports, in some embodiments, receive notification that a collision has occurred within the last two clock cycles. Where burst reads and writes are utilized, this information is useful to indicate a problem with the burst and a repeat of the burst may be in order. In some cases, the processor may monitor the number of collisions to determine if the number exceeds a threshold value. In random accesses, embodiments of collision detection that store the addresses where collisions have occurred or pipelining collision flags so that it is determined which cycle generated a collision is helpful in determining which operation may need to be repeated.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A multi-port memory system, comprising:
    a memory array with an addressable array of memory locations;
    at least two ports coupled to the memory array, each of the at least two ports transmitting to the memory array an address, a clock signal, and a read/write control signal; and
    a collision detect circuit coupled to receive the address, the clock signal, and the read/write control signal from each of the at least two ports,
    wherein the collision detect circuit sets a collision flag when a collision condition is detected in any of the at least two ports, the collision flag providing an indication that any of the at least two ports may have read or written corrupted data.

2. The system of claim 1, further including control logic coupled to the memory array to receive signals associated with the at least two ports and present signals to the memory array.

3. The system of claim 1, wherein the collision detect circuit sets the collision flag associated with one of the at least two ports if another of the at least two ports is executing a write operation to a memory location at the same time that that the one of the at least two ports accesses the memory location.

4. The system of claim 1, wherein the collision detect circuit comprises:
    an address compare circuit coupled to receive and compare addresses from each of the at least two ports and provide a match signals indicating which of the addresses are the same; and at least one collision detect logic coupled to receive the match signals and the read/write signals and provide a collision signal for a first port of the at least two ports if the match signals indicate an address match between the first port and a second port of the at least two ports and the read/write signal associated with the second port indicates a write operation;

at least one collision flag set circuit coupled to receive a collision signal from the collision detect logic and set a collision detect flag according to the clock signal associated with the first port.

5. The system of claim 4, wherein the collision flag set circuit associated with the first port comprises:

a flip-flop circuit that is set according to the collision detect flag;

a first latch that latches an output signal from the flip-flop circuit on a rising edge of the clock signal associated with the first port;

a second latch that latches a signal from the first latch on a falling edge of the clock signal associated with the first port; and an output driver coupled to receive a signal from the second latch and provide a collision detect flag.

6. The system of claim 5, wherein the flip-flop circuit is reset from the signal from the first latch.

7. The system of claim 5, further including a first-in-first-out circuit to store addresses in response to the collision signal.

8. A dual port memory system, comprising:

a memory array coupled to receive a left port memory address and a right port memory address; and a collision detect circuit configured to detect a match between the left port memory address and the right port memory address and generate a left port collision flag if the right port is writing data, and generate a right port collision flag if the left port is writing data, the collision flag providing an indication that one of the right port or the left port may have read or written corrupted data.

9. The system of claim 8, wherein the collision detect circuit includes an address compare circuit that provides a match signal when the left port address and the right port address are the same;

a left port collision detect circuit that provides a left port collision signal when the match signal exists and when the right port is writing;

a left port flip-flop that is set on the left port collision signal;

a first left port latch that latches a collision flag from the left port flip-flop on a rising edge of a left port clock signal, wherein the left port flip-flop is reset according to the collision flag output from the first left port latch;

a second left port latch that latches the collision flag from the first left port latch on a falling edge of the left port clock signal; and a left port output driver that provides the collision flag from the second left port latch.

10. The system of claim 9, further including a flip-flop that stores the left port address according to the left port collision signal.

11. A method of collision detection in a dual port memory system, comprising:

detecting that a left port address to be presented to a left port is identical to a right port address to be presented to a right port; and generating a left port collision flag if a write operation is being processed for the right port address at the right port, the collision flag providing an indication that the left port may have read or written corrupted data.

12. The method of claim 11, further including generating a right port collision flag if a write operation is being processed for the left port address at the left port, the collision flag providing an indication that the right port may have read or written corrupted data.

13. The method of claim 12, further including providing arbitration when either the left port collision flag or the right port collision flag is set.

14. A method of collision detection, comprising:

detecting an address match between two or more ports; and generating a collision flag for at least one of the two or more ports of any of the other of the two or more ports are writing, the collision flag providing an indication that at least one of the two or more ports may have read or written corrupted data.

15. The method of claim 14, further comprising:

providing arbitration when the collision flag is set.

* * * * *